United States Patent [19]

Kusumoto

[11] Patent Number: 5,612,565
[45] Date of Patent: Mar. 18, 1997

[54] SEMICONDUCTOR DEVICE HAVING CHANNEL BOUNDARY WITH UNEVEN SHAPE

[75] Inventor: Naoto Kusumoto, Kanagawa, Japan

[73] Assignee: Semiconductor Energy Laboratory Co., Ltd., Kanagawa-ken, Japan

[21] Appl. No.: 353,279

[22] Filed: Dec. 5, 1994

[30] Foreign Application Priority Data

Dec. 8, 1993 [JP] Japan ................................. 5-340705

[51] Int. Cl.$^6$ ................................................ H01L 29/06
[52] U.S. Cl. .......................... 257/401; 257/653; 257/344; 257/240
[58] Field of Search .................................. 257/240, 401, 257/344, 656, 653

[56] References Cited

U.S. PATENT DOCUMENTS

| | | | |
|---|---|---|---|
| 3,414,781 | 12/1968 | Dill | 257/401 |
| 3,586,930 | 6/1971 | Das | 257/401 |
| 4,894,694 | 1/1990 | Cham et al. | 257/344 |

*Primary Examiner*—Jerome Jackson
*Assistant Examiner*—Nathan K. Kelley
*Attorney, Agent, or Firm*—Sixbey, Friedman, Leedom & Ferguson; Gerald J. Ferguson, Jr.; Bradley D. Blanche

[57] ABSTRACT

A semiconductor device comprising a source region, a channel region, and a drain region, provided that one or both of the phase boundary between the channel forming region and the source region and that between the channel forming region and the drain region are shaped into an uneven shape, and optionally, periodically. Also claimed is a process for fabricating the same.

23 Claims, 7 Drawing Sheets

51 SOURCE   52 CHANNEL   53 DRAIN

56 SOURCE   57 CHANNEL   58 DRAIN

61 SOURCE   62 CHANNEL   63 DRAIN

SEMICONDUCTOR DEVICE HAVING CHANNEL BOUNDARY WITH UNEVEN SHAPE

BACKGROUND OF THE INVENTION

1. Industrial Field of the Invention

The present invention relates to a structure of an insulated gate field effect semiconductor device, and to a process for fabricating the same.

2. Prior Art

Insulated gate field effect semiconductor devices using a thin film semiconductor, particularly a thin film silicon semiconductor, are well known in the art. The devices of this type are called as thin film transistors or TFTs (which are hereinafter referred to collectively as "TFTs"), and are used in active matrix addressed liquid crystal display devices and other integrated circuits.

Referring to FIGS. 2(A) and 2(B), a representative structure of a TFT for the use of switching elements of pixel electrodes and in peripheral driver circuits of a liquid crystal display device is described below. FIG. 2(A) is a cross sectional view of the TFT and FIG. 2(B) is a top planar view of the cross section along line A-A' of FIG. 2(A).

Referring to FIG. 2(A), a base silicon oxide film 202 is formed on a glass substrate 201. The silicon oxide film reduces the diffusion of impurities from the glass substrates to the silicon film formed thereon, and the unfavorable stress applied to the silicon film.

An active layer comprising a source or drain region 203, a drain or source region 205, and a channel forming region 204 is provided on the base film 202. Referring to FIG. 2(A). the island-like regions 203, 204, and 205 correspond to the active layer. The active layer comprises an amorphous silicon film or a crystalline silicon film (generally a polycrystalline silicon or microcrystalline silicon, collectively denoted as "polysilicon").

The source or drain region 203 and the drain or source region 205 are rendered a single conductive type. The channel forming region 204 is basically intrinsic (I-type). An interface 206 is incorporated as a phase boundary. The source or drain region 203 and the drain or source region 205 are fabricated by doping an impurity for imparting the desired conductive type to the regions by means of ion implantation and the like using a gate electrode 208 as a mask.

A silicon oxide film 207 which functions as a gate insulating film is formed on the active layer, and a gate electrode 208 is formed on the gate insulating film. A source or drain electrode 210 and a drain or source electrode 211 are formed with an interlayer insulating film 209 on the upper part of the structure.

Referring to FIG. 2(B), the phase boundary 206 is formed linearly between the source or drain region 203 and the channel forming region 204, and between the drain or source region 205 and the channel forming region.

Because a TFT, as illustrated in FIGS. 2(A) and 2(B), uses a thin film semiconductor having from 1,000 to several thousands of Angstroms in thickness, the current flow between the source and the drain is limited. Thus, the width 214 of the active layer must be increased in case of flowing a current in a larger quantity.

In case the peripheral driver circuit (that is, a circuit for driving a plurality of pixel electrodes arranged into a matrix) of a liquid crystal display device is constructed of TFTs, a large flow of current is required. Thus, with reference to FIG. 2(B), in which the channel width 214 is set at the same width as that 212 of the active layer, it is necessary to form a channel having a width 214 of from 80 to 100 µm with respect to a channel length 213 of about 20 µm.

However, due to the limitation in the size of the element, it is not possible to increase the channel width as required.

SUMMARY OF THE INVENTION

In the light of the aforementioned circumstances, an object of the present invention is to provide a structure capable of flowing current at a large quantity without increasing the channel width.

Thus, according to an embodiment of the present invention, there is provided a semiconductor device comprising a source region, a channel region, and a drain region, provided that one or both of the phase boundary between the channel forming region and the source region and that between the channel forming region and the drain region have an uneven shape.

The boundary between the channel region and the source region typically has a waveform having a substantially same amplitude as the amplitude of the waveform of the boundary between the channel region and the drain region.

The uneven shape of the phase boundary may be formed into a substantially periodical shape. The periodical shape can be expressed by a predetermined periodical function.

FIG. 1(A) shows schematically a TFT according to the present invention. FIG. 1(A) shows an upper plane view of the active layer corresponding to the structure illustrated in FIG. 2(B). Referring to FIG. 1(A), the structure comprises a source or drain region 11 and a drain or source region 13, with a channel forming region 12 incorporated therebetween. The structure illustrated in FIG. 1(A) is characterized in that the phase boundary 14 between the source or drain region 11 and the channel forming region 12, and the boundary 15 between the drain or source region 13 and the channel forming region 12 are provided in a wavy shape, respectively.

The structure shown in FIG. 1(A) can be realized by fabricating the source and drain regions in a self-aligned manner by means of ion implantation using a gate electrode having a wavy uneven shape 12 as a mask. As a matter of course, the diffusion of the impurity implanted into the source and drains for imparting thereto a conductive type must be also considered in this case.

The structure above can be implemented not only by ion implantation, but also by irradiating a laser beam in an atmosphere containing the element to be doped, or by irradiating a laser beam after depositing a thin film containing the dopant. These means are also effective for incorporating impurities into the structure in a self-aligned manner using the gate electrode as a mask.

The wavy uneven phase boundary 15 is formed in such a manner to have approximately the same phase as that of the wavy uneven phase boundary 14. More specifically, the convex portion of one phase boundary corresponds to the concave portion of the other phase boundary. Thus, the distance (interval) 16 between the phase boundaries is maintained approximately constant over the entire structure.

The maximum effect can be obtained by forming the wavy uneven phase boundaries 14 and 15 at the same phase. It is confirmed that a minimum effect results in if the phase boundaries are formed in phases reversed to each other.

In the foregoing description, special reference was made to a wavy shape for the uneven phase boundaries 14 and 15. However, the phase boundaries may be formed as a combination of a triangular shape and a shape differing thereto. It is also possible to apply the present invention to either one of the phase boundaries, i.e., that between the channel forming region and the source region and that between the channel forming region and the drain region. Needless to say, it is more effective to employ the uneven shapes for both of the phase boundaries.

The present invention can be applied to the phase boundaries in case offset gate intrinsic regions, or lightly doped regions such as LDDs are provided in the phase boundary between the channel forming region and the source and/or drain region or in the vicinity thereof. In such a case, the present invention can be applied to the phase boundary between the offset regions or the lightly doped regions and the source and/or drain regions.

In general, the use of an LDD structure or offset structure reduces the absolute value of the OFF current. However, it also lowers the ON current and the carrier mobility. The drop in ON current can be compensated by the application of the constitution according to the present invention. Thus, a structure reduced in OFF current alone while maintaining the high ON current can be implemented by the use of the present invention.

The quantity of the ON current flow can be increased by forming the phase boundary between the channel region and the source/drain region in an uneven shape. In particular, a structure capable of flowing a current 1.5 times that of the current flow obtained in a structure having a planar phase boundary can be realized by forming periodic phase boundaries in the same phase. The mobility can be increased at the same time.

Furthermore, a high ON/OFF ratio can be obtained by increasing the ON current. Thus, a device having a high ON/OFF ratio can be implemented.

DETAILED DESCRIPTION OF THE PREFERRED EMBODIMENTS

The present invention is described in further detail below referring to the preferred embodiments according to the present invention. It should be understood, however, that the present invention is not to be construed as being limited to the examples below.

EXAMPLE 1

Figure 1A:
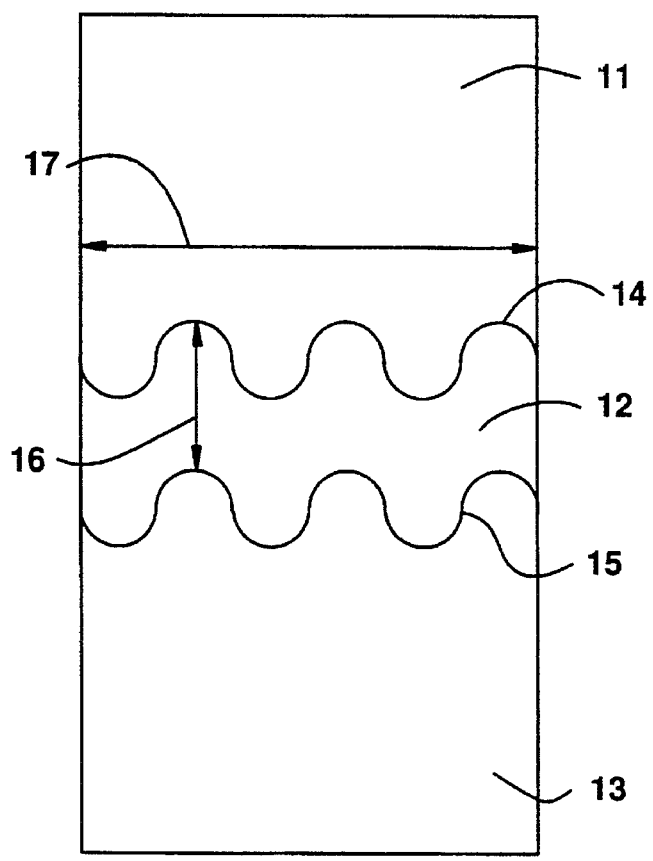
FIGS. 1(A) and 1(B) are an explanatory diagram showing the constitution of a semiconductor device according to an embodiment of the present invention.

Referring to FIGS. 3(A) to 3(D), a process for fabricating a device according to an embodiment of the present invention is described below. The plan view of the device is shown in FIGS. 1(A) and (B). The present example refers to a case in which the TFT is formed on a glass substrate, however, other insulator or semiconductor substrates such as a silicon substrate can also be used as the substrate for the implementation of a device according to the present invention.

Figure 3A:
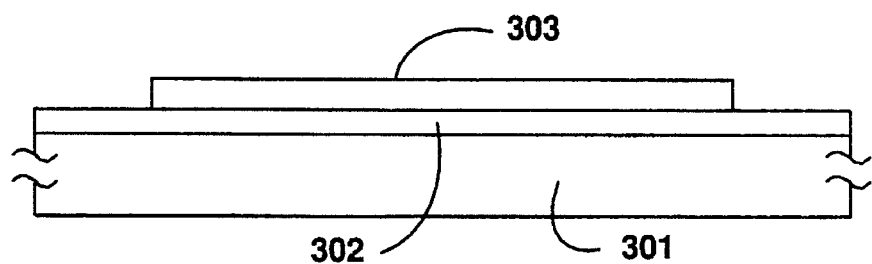
FIGS. 3(A) to 3(D) are a diagram showing the step sequential structures obtained in the process for fabricating a semiconductor device according to the present invention.
Figure 3B:
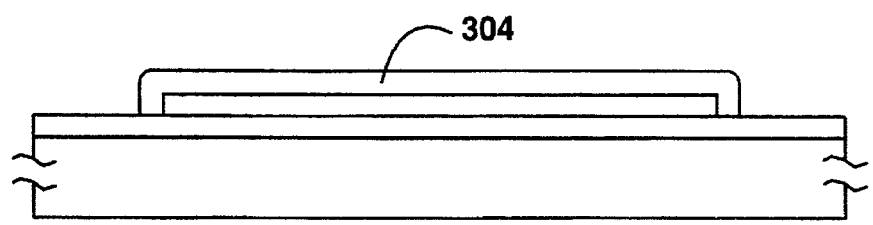
Figure 3C:
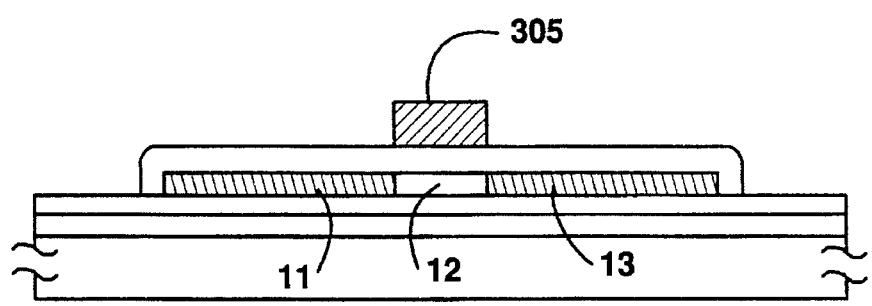
Figure 3D:
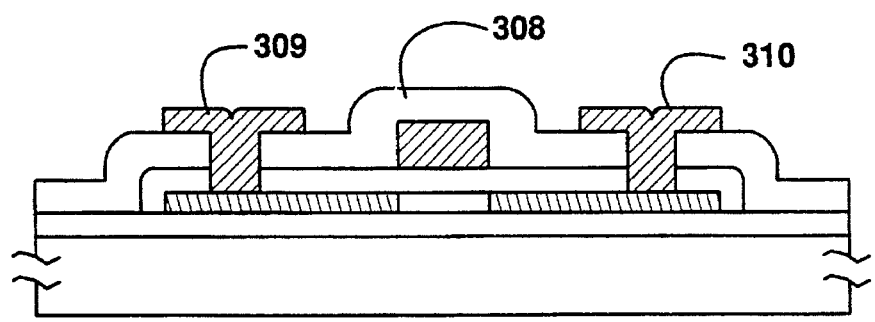

A 2,000 Å thick silicon oxide layer 302 is deposited by sputtering as a base film on a Corning 7059 glass substrate 301 as shown in FIG. 3(A).

A 1,000 Å thick intrinsic (I-type) amorphous silicon semiconductor film is deposited thereafter by plasma-assisted CVD. The resulting amorphous silicon film is then crystallized by irradiating laser radiation thereto using a KrF excimer laser operated at a wavelength of 248 nm and at a pulse width of 20 nsec. The amorphous silicon film can be otherwise crystallized by means of heating. Furthermore, the amorphous silicon film can be left over as it is without being crystallized. The silicon film is patterned thereafter to form an island-like silicon film portion 303 as the active layer for the TFT (FIG. 3(A)).

The silicon oxide film 304 is then formed to a thickness of 1,000 Å as a gate insulating film. In the present example, the silicon oxide film 304 is formed by means of sputtering (FIG. 3(B)).

A 6,000 Å thick polycrystalline silicon film containing 0.1% of phosphorus is deposited thereafter by means of low pressure CVD. The resulting silicon film is patterned to form a gate electrode 305. A mask pattern having a wave shape 12 as shown in FIG. 1(A) is used in this case.

Thus is obtained a wave pattern formed of the above mask pattern having protrusions and concave portions constructed from half circles about 4 μm in radius. The channel is formed at a length 16 of about 8 μm and at a width 17 of 30 μm (FIG. 1(B)).

A gate electrode 305 having a pair of opposing side planes with wavy shapes (uneven surfaces) is formed in this manner. The present example refers to a gate electrode comprising a silicon of a mono-conductive type. However, gate electrodes using other materials such as aluminum can also be used.

An impurity for imparting N-type conductivity, phosphorus in this case, is doped by means of ion implantation with the gate electrode 305 as a mask. The impurity is incorporated at a dose of $5 \times 10^{15}$ cm$^{-2}$ in this case by effecting the ion implantation at an accelerating voltage of 80 kV and using phosphine (PH$_3$) as the doping gas. N-type impurity regions 11 and 13 are formed in this manner. The resulting regions provides the source and drain regions 11 and 13 as illustrated in FIG. 1(A). A channel forming region 12 is formed in a self-aligned manner at the same time (FIG. 3 (C)).

The resulting structure is annealed thereafter by irradiating a laser light. The laser light emitted from a KrF excimer laser operated at a wavelength of 248 nm and at a pulse width of 20 nsec is used in this case. It is further effective to heat the substrate to a range of from about 200° to 450° C. while irradiating the laser light to the substrate.

Subsequently, a 6,000 Å thick silicon oxide film 308 is formed by plasma-assisted CVD to provide an interlayer insulating film. Then, aluminum electrodes with interconnections 309 and 310 are fabricated after forming contact holes. The resulting structure is then completed into a TFT by annealing the structure at 330° C. for a duration of 30 minutes under a pressure of 1 arm in hydrogen atmosphere (FIG. 3(D)).

Figure 2A:
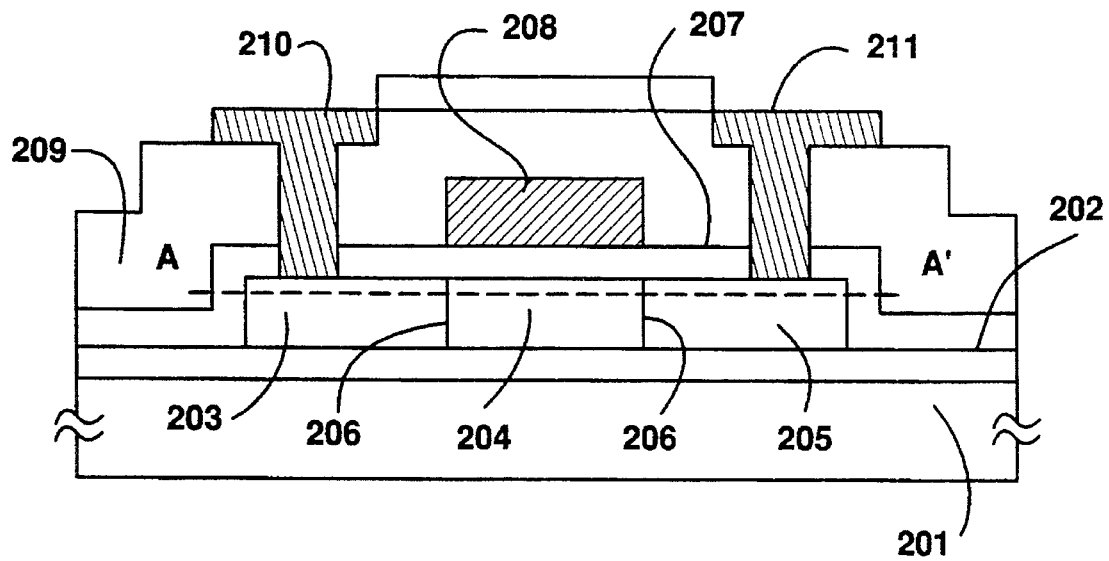
FIG. 2(A) is a cross-sectional view of a typical semiconductor device.
Figure 2B:
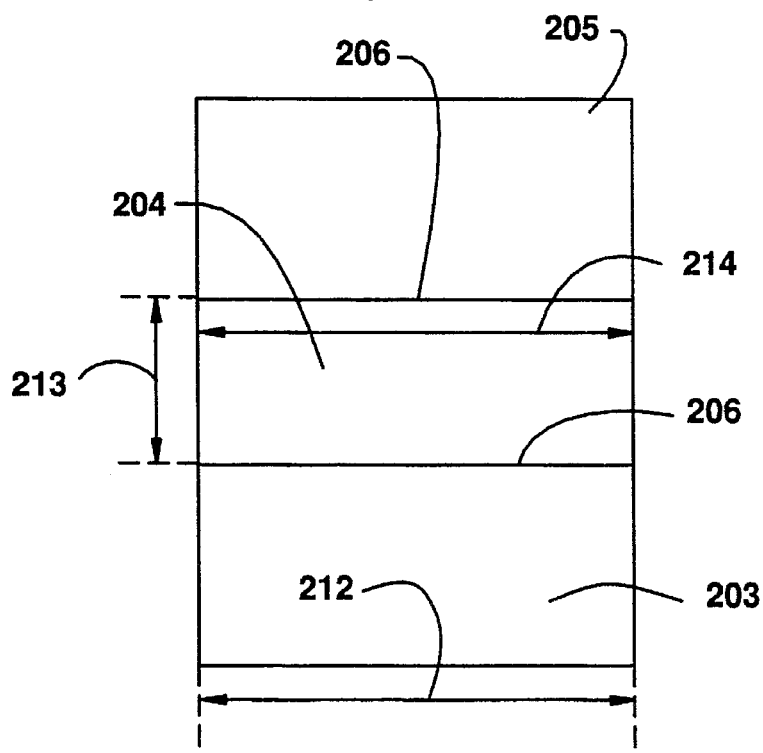
FIG. 2(B) is a plan view of an active layer of a prior art semiconductor device.

The TFT according to the present invention allows an ON current to flow at a quantity 1.5 times that of a TFT having a conventional structure as shown in FIG. 2(B). It is confirmed that the mobility is increased corresponding to the increase in flow of the ON current.

Figure 4A:
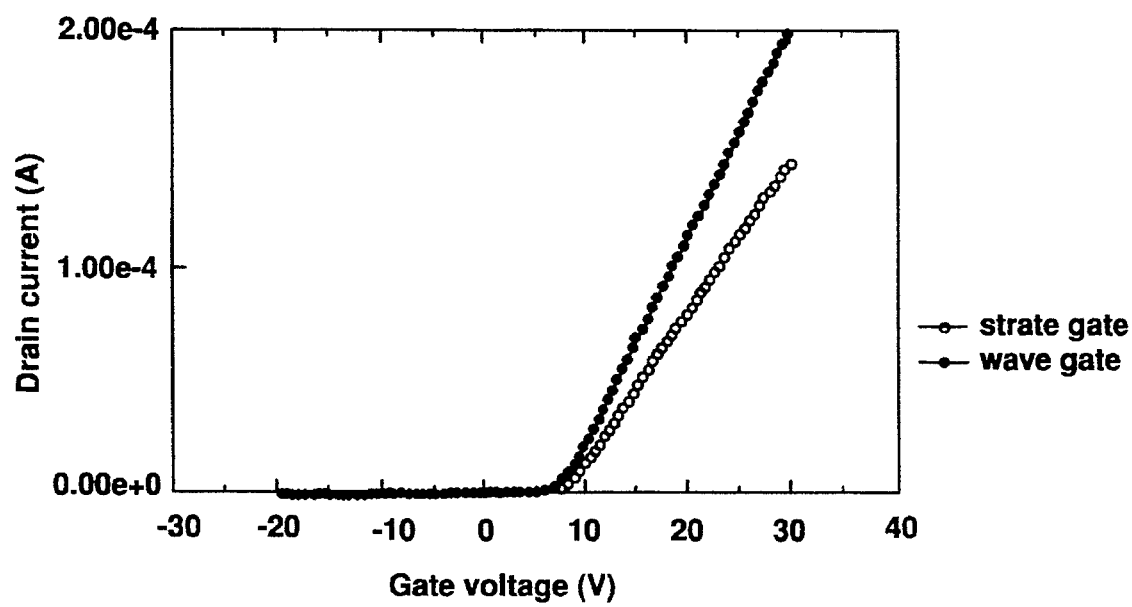
FIGS. 4(A) and 4(B) are each the characteristics curves obtained for a semiconductor device according to an embodiment of the present invention.

An experimental data showing the characteristics of the TFT according to the present invention, which is capable of flowing a larger ON current, is illustrated in FIG. 4(A). Referring to FIG. 4(A), the data for a conventional TFT having a straight gate with reference to FIG. 2(B) is plotted with open circles in comparison with those shown with filled circles for the present TFT comprising a gate having a wavy phase boundary. The size and the conditions of fabrications are the same for the both TFTs except for the shape of the phase boundary between the source and the channel and that between the drain and the channel.

Referring to FIG. 4(A), it can be seen that the ON current of the TFT as plotted with filled circles can be increased to 1.5 times that of the conventional type by employing the constitution according to the present invention.

Figure 4B:
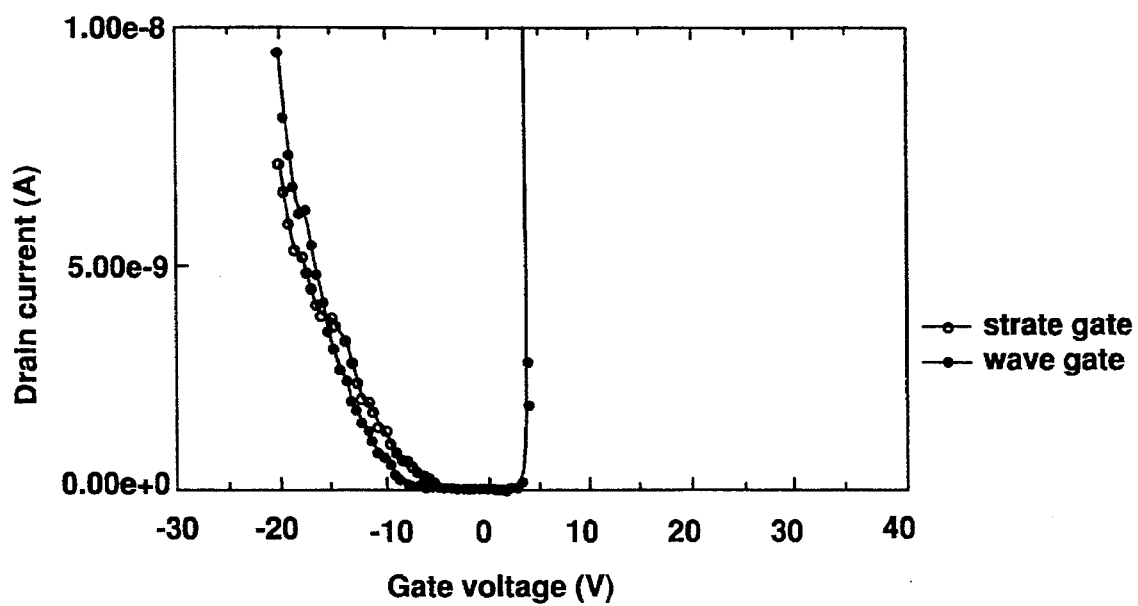

FIG. 4(B) is the enlarged portion of the graph shown in FIG. 4(A) corresponding to the negative side of the gate voltage. In other words, FIG. 4(B) shows the OFF current characteristics of the TFT. It can be seen clearly from FIG. 4 (B) that the OFF current characteristics is approximately the same as that of the conventional type. Conclusively, the ON/OFF ratio can be increased by employing the constitution according to the present invention.

Conventionally, the OFF current of a TFT is reduced by providing an LDD region or an offset gate region. The above method inevitably accompanies a decrease of ON current. However, with reference to FIGS. 4(A) and 4(B), the structure according to the present invention provides a higher ON to OFF ratio by increasing the ON current alone. The present invention provides an outstanding TFT as compared with the conventional means utilizing an LDD region or an offset region.

It is also confirmed that a structure having a wavy phase boundary between the channel and the source or drain is not at all effective in case the wavy shapes are provided in a reversed phase. Thus, it is preferred to provide the wavy shapes to be in phases as near as possible with each other.

EXAMPLE 2

Figure 1B:
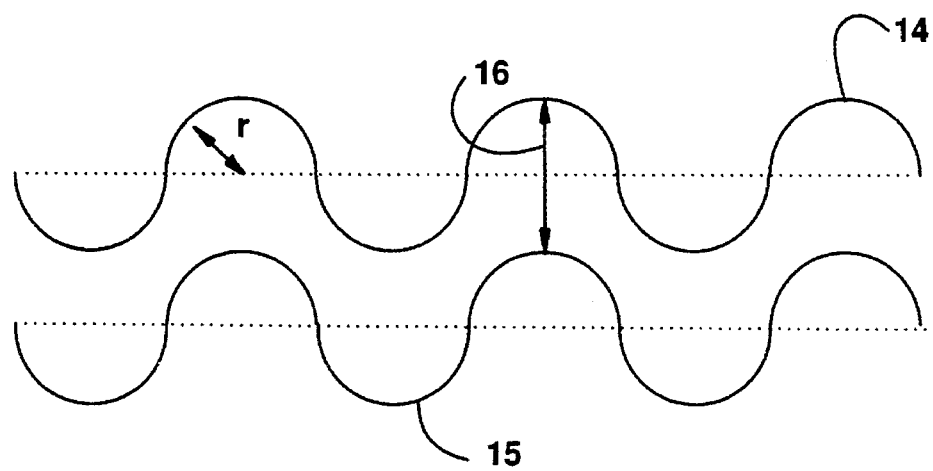

Referring to FIGS. 1(A) and 1(B), the present example refers to a case in which the phase boundary is shaped into a shape 14 and 15. The specific cases described herein can be implemented by simply selecting various types of masks in fabricating the gate electrode 303.

The phase boundaries in the present case are formed in the same periodic shape and in the same phase.

Figure 5A:
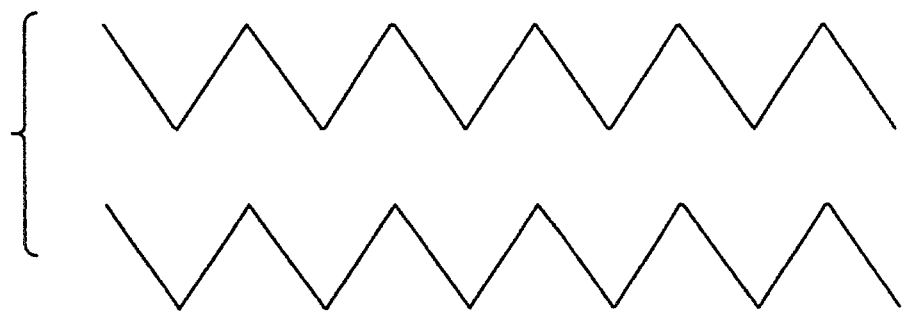
FIGS. 5(A) to 5(C) are each explanatory figures for the structures according to the present invention.
Figure 5B:
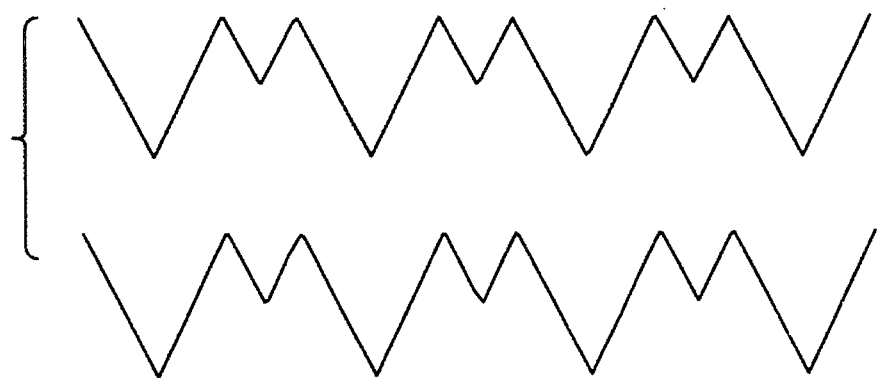

Referring to FIG. 5(A), the phase boundaries corresponding to numerics 14 and 15 in FIGS. 1(A) and 1(B) are provided in the form of a triangular wave. Referring to FIG. 5(B), large and small triangular convex portions and concave portions are provided periodically. In the embodiment with reference to FIG. 5(C), the phase boundaries are provided in periodic and gentle curves.

Figure 5C:
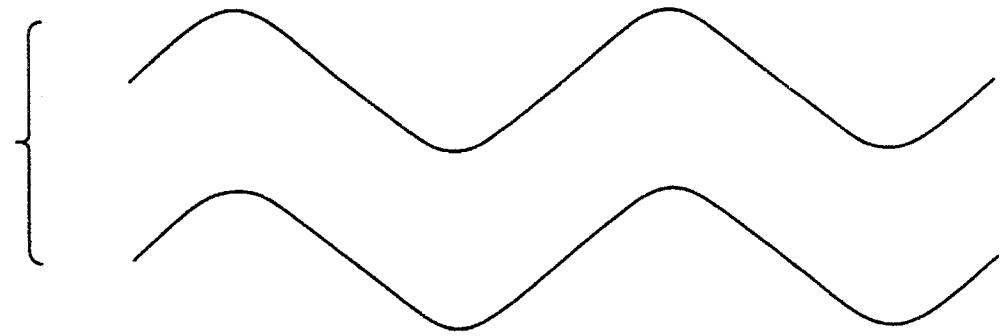

In FIGS. 5(A) to 5(C), each of the opposed phase boundaries are provided periodically and in the same phase. The phase need not to be the same, however, the best effect can be obtained in case the boundaries are formed in the same phase. Furthermore, the phase boundaries need not to be identical to each other, nor be completely periodical. However, the shapes of the phase boundaries are preferably similar to each other.

The structure preferably comprises portions repeated as many times as possible. The resistance of the protruded portions can be reduced in this manner.

EXAMPLE 3

The present example provides a TFT having a high ON/OFF ratio by lowering the current density at the phase boundary between the channel and the drain.

The OFF current of a TFT can be lowered by implementing an LDD (lightly doped drain) structure or an offset structure. These structures relax the intense electric field in the phase boundary between the channel and the drain. Furthermore, by providing a region having the maximum electric field in the outer side of the gate region, these structures suppress the generation of hot carriers.

In the TFT of the present example, the apparent current density at the phase boundary between the channel and the drain is lowered to increase the ON/OFF ratio.

With reference to FIG. 4, it can be seen that the ON current alone is increased to about 1.5 times as compared with the conventional case in a TFT as described in Example 1. Because the OFF current is maintained unchanged, the ON/OFF ratio can be increased to about 1.5 times that of a conventional TFT.

The principle why such an increase in ON current as illustrated in FIG. 4 can be obtained is yet to be clarified, however, it is assumed due to the decrease in apparent current density at the phase boundary between the channel and the drain. Accordingly, the present example provides a TFT having a high ON/OFF ratio by lowering the apparent current density at the boundary between the channel and the drain.

The term "period" as referred hereinafter means a characteristic length in the repetition of protrusions and concave portions. The term "phase" as referred hereinafter refers to the state in change of the shape having the protrusions and concave portions which change within a constant period. For example, in case two phase boundaries each having periodically changing protrusions and concave portions are positioned in parallel with each other, the two phase boundaries are said to have the same phase if one phase boundary has a shape changing in correspondence with that of the other phase boundary in such a manner that the concave corresponds to the protrusion and vice versa. If one phase boundary provides a concave in correspondence with the concave of the other phase boundary, the two phase boundaries are in the reversed phase relationship. The amplitude as referred herein means the height of the protrusions and concaves.

Figure 6A:
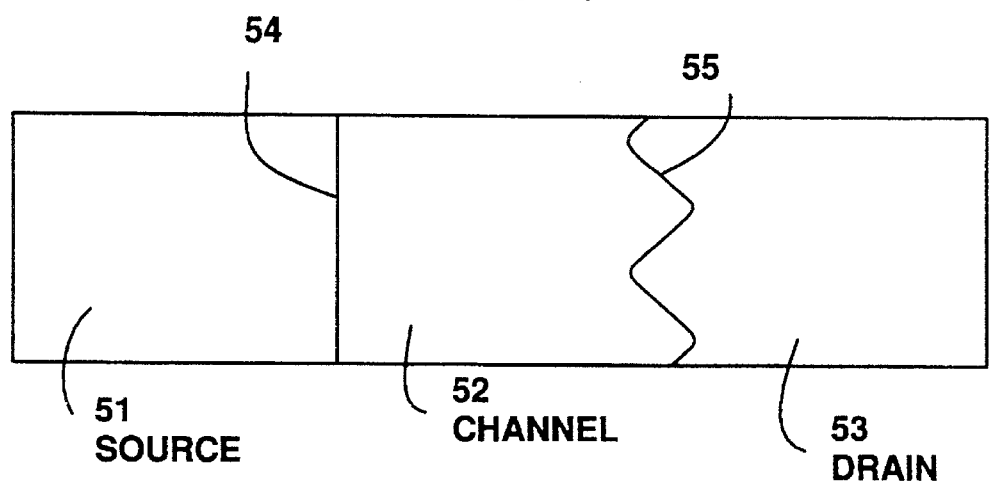
FIGS. 6(A) to 6(C) are each explanatory figures for the structures according to the present invention.

Referring to FIG. 6(A), a TFT according to an embodiment of the present invention is described. The TFT comprises a source region 51, a channel forming region 52, and a drain region 53 in correspondence with those illustrated in FIG. 1(A) or FIG. 2(B). The phase boundaries 54 and 55 are also formed in particular shapes.

In the TFT according to the embodiment of the present invention with reference to FIG. 6(A), the phase boundary 54 between the source region 51 and the channel forming region 52 is formed linearly in the same manner as that of an ordinary TFT, and the boundary 55 between the channel forming region 52 and the drain region 53 is formed into a wavy shape.

By providing a TFT in this particular structure, the current density per unit area in the phase boundary 55 can be lowered to increase the ON current in a manner shown in FIG. 4. In other words, the ON/OFF ratio can be increased. As a matter of course, a further effective TFT can be implemented by providing a wavy phase boundary 54 between the source and the channel in a manner similar to that of the boundary 55.

Figure 6B:
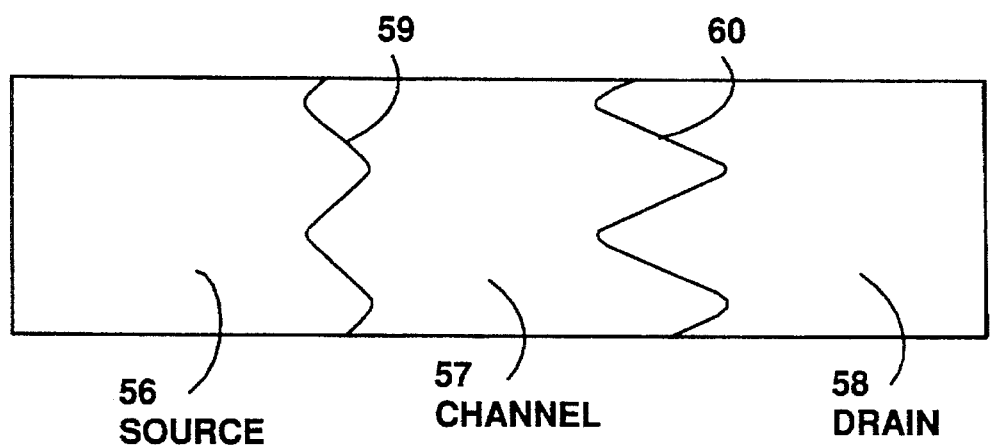

Referring to the TFT as illustrated in FIG. 6(B), the phase boundary 59 between the source region 56 and the channel forming region 57 as well as the boundary 60 between the channel forming region 57 and the drain region 58 are provided in a wavy shape. The shapes of the two phase boundaries are formed in the same period and phase with each other, but differing from each other in amplitude.

In case a TFT as shown in FIG. 6(B) is implemented. the surface area of the phase boundary 60 can be set larger than that of the boundary 59. Thus, the current density in the phase boundary 60 can be reduced as compared with that in the boundary 59.

Thus, the same effect as that obtained in Example 1 can be obtained in the TFT with reference to FIG. 6(B).

Figure 6C:
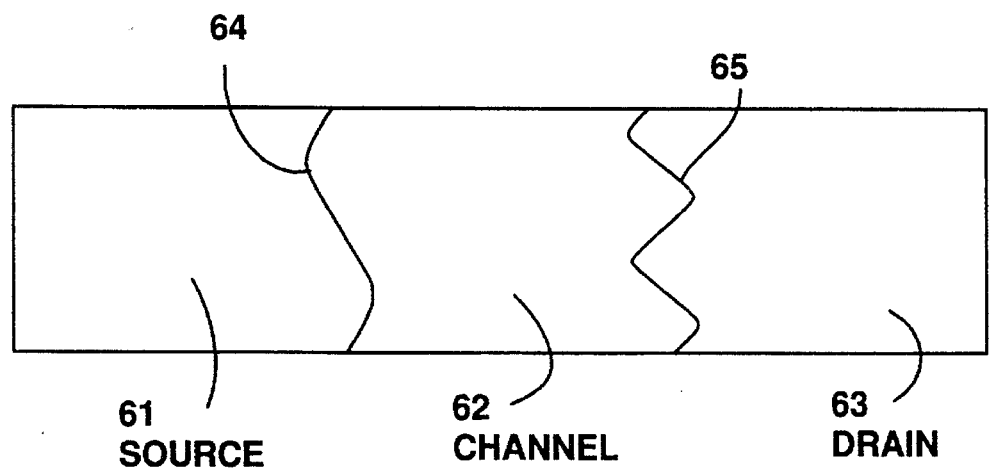

Referring to the TFT as illustrated in FIG. 6(C), the phase boundary 64 between the source region 61 and the channel forming region 62 as well as the boundary 65 between the channel forming region 62 and the drain region 63 are provided in a wavy shape but in a period differing from each other.

In case a TFT is fabricated in the structure with reference to FIG. 6(C), a larger surface area can be set for the phase boundary 65 as compared with that of the boundary 64. Thus, the current density in the phase boundary 65 can be lowered than that in the boundary 64.

Thus, the same effect as that obtained in Example 1 can be obtained in the TFT with reference to FIG. 6(C). Furthermore, the TFTs of FIGS. 6(A)–6(C) are formed such that the amplitude of the phase boundary is smaller than the length of the associated channel.

EXAMPLE 4

The present example refers to a TFT having an offset region (generally called as an "offset gate region") according to another embodiment of the present invention.

Figure 7:
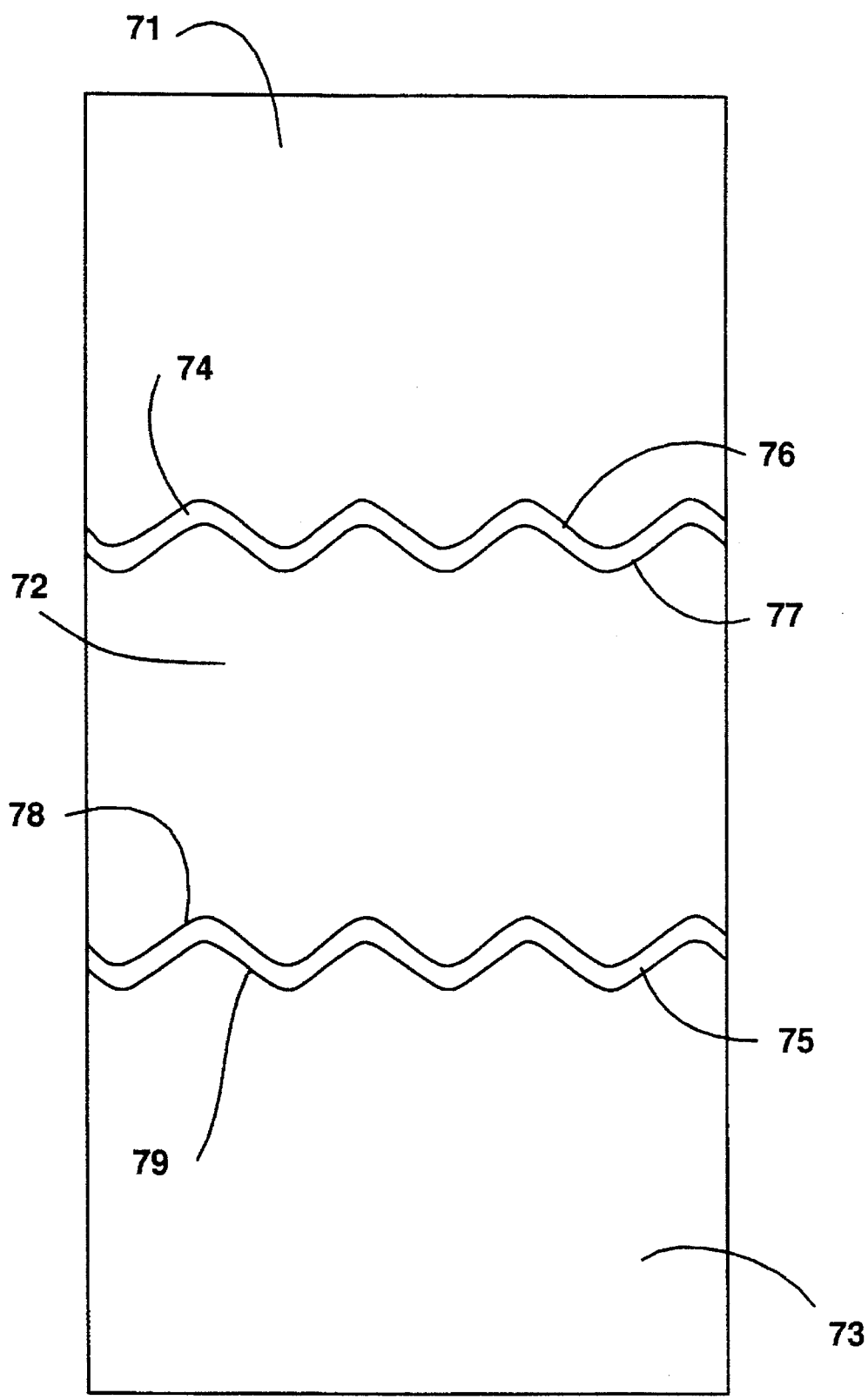
FIG. 7 shows a structure for a semiconductor device according to an embodiment of the present invention.

Referring to the schematic structure illustrated in FIG. 7, the TFT according to the present example is described below. FIG. 7 is a top view of the active layer corresponding to FIG. 1(A). Referring to FIG. 7, the active layer comprises a source region 71, an offset region 74, a channel region 72, an offset region 75, and a drain region 73. The offset region 74 is provided in contact with the channel region 72 and the source/drain region 71. The offset region 75 is provided in contact with the channel region 72 and the drain/source region 73.

The offset region is provided from an intrinsic or a substantially intrinsic semiconductor. Because this region is located at a position offset from the gate electrode, the structure is sometimes referred to as an offset gate region.

The offset regions 74 and 75 can be replaced by a semiconductor having a single conductive type constituting the lightly doped source and drain regions 71 and 73. In case the semiconductor for the source and drain regions is used for the regions 74 and 75, the concentration of the impurity for imparting the conductive type is reduced to a level lower than that in the source and drain regions 71 and 73. More specifically, N- or N−-type regions 74 and 75 are fabricated in case N+ type source and drain regions 71 and 73 are formed.

In case that the region 75 is a lightly doped region 75, a lightly doped drain (LDD) structure can be implemented.

In the present example, wavy phase boundaries are provided for the boundary 76 between the source region 71 and the offset region 74, as well as for the boundaries 77, 78, and 79, corresponding to the boundaries of the pairs of offset region 74 and channel forming region 72, channel forming region 72 and offset region 75, and offset region 75 and drain region 73, respectively.

The aforementioned phase boundaries 76 to 79 are each provided in a similar wavy shape having the same phase. Furthermore, the amplitude of each of the phase boundaries is smaller than the channel length of the associated channel.

In the TFT according to the present example, the OFF current can be reduced without lowering the ON current if the decrease in ON current ascribed to the offset structure is compensated by the increase in ON current which results by providing wave-shaped uneven phase boundaries 76 to 79 in a same phase. If the increment in ON current which results by providing the wavy uneven phase boundaries 76 to 79 in the same phase surpasses the decrement in ON current due to the formation of an offset structure, the ON current can be effectively increased while simultaneously reducing the OFF current.

If the effect need not to be exhibited to a full extent, not all of the phase boundaries 76 to 79 need to be formed in an uneven shape. At least one of the phase boundaries need to be formed in the uneven shape. Considering the phase relationship, not all need to be the same.

As described in the foregoing, the present invention provides TFTs capable of flowing ON current at larger quantities by providing a phase boundary having a periodical uneven shape between the channel forming region and the source region or the drain region. Thus, the present invention provides compact TFTs capable of handling current flow in larger quantities. Because the ON current alone can be increased, a higher ON/OFF ratio can be achieved. Furthermore, by employing an offset gate structure or a lightly doped drain structure in combination of the embodiments according to the present invention, TFTs having a low OFF current can be implemented.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising a source region, a drain region, and a channel region provided between the source region and the drain region, wherein at least one of a boundary between the channel region and the source region and a boundary between the channel region and the drain region has an uneven shape having an amplitude smaller than a channel length of the channel region.

2. The device of claim 1 wherein said at least one of the boundary between the channel region and the source region and the boundary between the channel region and the drain region has a shape having a substantially periodical unevenness.

3. The device of claim 1 wherein the uneven shape can be expressed by a periodical function.

4. The device of claim 1 wherein the boundary between the channel region and the source region and the boundary between the channel region and the drain region have a substantially constant interval therebetween.

5. A semiconductor device comprising a source region, a drain region, and a channel region provided between the source region and the drain region, wherein at least one of a boundary between the channel region and the source region and a boundary between the channel region and the drain region has a shape having a substantially periodical unevenness and having an amplitude smaller than a channel length of the channel region.

6. The device of claim 5 wherein the shape can be expressed by a periodical function.

7. The device of claim 5 wherein the boundary between the channel region and the source region and the boundary between the channel region and the drain region have a substantially constant interval therebetween.

8. A semiconductor device comprising a source region, a drain region, and a channel region provided between the source region and the drain region, wherein at least one of a boundary between the channel region and the source region and a boundary between the channel region and the drain region has an uneven shape expressed by a periodical function and having an amplitude smaller than a channel length of the channel region.

9. The device of claim 8 wherein the boundary between the channel region and the source region and the boundary between the channel region and the drain region have a substantially constant interval therebetween.

10. The device of claim 8 wherein the boundary between the channel region and the source region and the boundary between the channel region and the drain region are related by substantially the same phase relation.

11. A semiconductor device comprising a source region, a drain region, and a channel region provided between the source region and the drain region, wherein each of a boundary between the channel region and the source region and a boundary between the channel region and the drain region has a shape having a substantially periodical unevenness and having an amplitude smaller than a channel length of the channel region.

12. The device of claim 11 wherein amplitude of the boundary between the channel region and the source region is substantially same as that of the boundary between the channel region and the drain region.

13. The device of claim 11 wherein period of the periodical unevenness of the boundary between the channel region and the drain region is substantially same as that of the boundary between the channel region and the source region.

14. A semiconductor device comprising a channel region and a drain region, wherein boundary between the channel region and the drain region has an uneven shape having an amplitude smaller than a channel length of the channel region.

15. A semiconductor device comprising a source region, a drain region, and a channel region provided between the source region and the drain region with a substantially intrinsic offset region being provided between the channel region and the drain region, wherein boundary between the channel region and the offset region and boundary between the offset region and the drain region have an uneven shape having an amplitude smaller than a channel length of the channel region.

16. A semiconductor device comprising a source region, a drain region, and a channel region provided between the source region and the drain region with a lightly doped region being provided between the channel region and the drain region, wherein boundary between the channel region and the lightly doped region and boundary between the lightly doped region and the drain region have an uneven shape having an amplitude smaller than a channel length of the channel region.

17. A semiconductor device comprising a source region, a drain region, and a channel region provided between the source region and the drain region with a substantially intrinsic offset region being provided in contact with the channel region, wherein boundary between the channel region and the offset region and boundary between the offset region and the drain region have an uneven shape having an amplitude smaller than a channel length of the channel region.

18. A semiconductor device comprising a source region, a drain region, and a channel region provided between the source region and the drain region with a lightly doped region being provided in contact with the channel region, wherein boundary between the channel region and the lightly doped region and boundary between the lightly doped region and the drain region have an uneven shape having an amplitude smaller than a channel length of the channel region.

19. A semiconductor device comprising a source region, a drain region, and a channel region provided between the source region and the drain region with a substantially intrinsic offset region being provided in contact with at least one of the source region and the drain region, wherein boundary between the offset region and said at least one of the source region and the drain region has an uneven shape having an amplitude smaller than a channel length of the channel region.

20. A semiconductor device comprising a source region, a drain region, and a channel region provided between the source region and the drain region with a lightly doped region being provided in contact with at least one of the source region and the drain region, wherein boundary between the lightly doped region and said at least one of the source region and the drain region has an uneven shape having an amplitude smaller than a channel length of the channel region.

21. A semiconductor device comprising:

a source region, a drain region, and a channel region provided between the source region and the drain region; and a gate electrode provided adjacent to the channel region with a gate insulator therebetween, wherein at least one of a boundary between the channel region and the source region and a boundary between the channel region and the drain region has an uneven shape having an amplitude smaller than a channel length of the channel region and is aligned with a corresponding side of the gate electrode.

22. A semiconductor device comprising a source region, a drain region, and a channel region provided between the source region and the drain region with a substantially intrinsic offset region being provided in contact with at least one of the source region and the drain region, wherein boundary between the offset region and the at least one of the source region and the drain region has an uneven shape having an amplitude smaller than a channel length of the channel region, and wherein width of the offset region from the channel region to the at least one of the source region and the drain region is uniform.

23. A semiconductor device comprising a source region, a drain region, and a channel region provided between the source region and the drain region with a lightly doped region being provided in contact with at least one of the source region and the drain region, wherein boundary between the lightly doped region and the at least one of the source region and the drain region has an uneven shape having an amplitude smaller than a channel length of the channel region, and wherein width of the lightly doped region from the channel region to the at least one of the source region and the drain region is uniform.

* * * * *